United States Patent [19]

Weitzel et al.

[11] Patent Number: 5,677,230
[45] Date of Patent: Oct. 14, 1997

[54] METHOD OF MAKING WIDE BANDGAP SEMICONDUCTOR DEVICES

[75] Inventors: Charles E. Weitzel; Edward L. Fisk, both of Mesa; Sung P. Pack, Tempe, all of Ariz.

[73] Assignee: Motorola, Schaumburg, Ill.

[21] Appl. No.: 566,333

[22] Filed: Dec. 1, 1995

[51] Int. Cl.⁶ .............. H01L 21/302; H01L 21/304; H01L 21/306; H01L 21/76
[52] U.S. Cl. .................... 437/67; 437/100; 437/231
[58] Field of Search ................. 437/67, 100, 231

[56] References Cited

U.S. PATENT DOCUMENTS

| | | | |
|---|---|---|---|
| 3,400,309 | 9/1968 | Doo | 437/100 |
| 5,270,244 | 12/1993 | Baliga | 437/100 |
| 5,308,445 | 5/1994 | Takasu | 437/100 |
| 5,338,942 | 8/1994 | Nishida et al. | 257/17 |
| 5,374,412 | 12/1994 | Pickering et al. | 437/100 |
| 5,385,855 | 1/1995 | Brown et al. | 437/100 |
| 5,514,604 | 5/1996 | Brown | 437/100 |
| 5,516,625 | 5/1996 | McNamara et al. | 437/67 |
| 5,518,950 | 5/1996 | Ibok et al. | 437/67 |
| 5,561,078 | 10/1996 | Tasaka | 437/67 |
| 5,565,376 | 10/1996 | Lur et al. | 437/67 |
| 5,604,149 | 2/1997 | Paoli et al. | 437/67 |
| 5,612,232 | 3/1997 | Thero et al. | 437/100 |

*Primary Examiner*—Charles L. Bowers, Jr.
*Assistant Examiner*—Lynne A. Gurley
*Attorney, Agent, or Firm*—Eugene A. Parsons

[57] ABSTRACT

A method of planarizing wide bandgap semiconductor devices selected from a group including SiC, GaN and diamond having a mesa defined thereon by a trench with a depth of 1 to 2 micrometers and a width of 2 to 10 micrometers. A layer of dielectric material is deposited on the substrate overlying and surrounding the mesa, to a height approximately equal to the height of the mesa and the dielectric material is etched from atop the mesa and from a surrounding area. Layers of spin on glass are deposited to fill the surrounding area and etched to achieve a planar surface including the mesa and the layer of dielectric material.

21 Claims, 2 Drawing Sheets

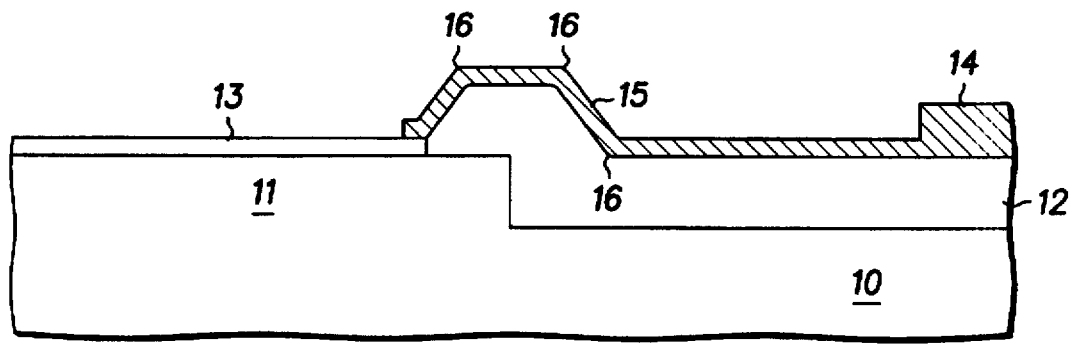
*FIG. 1* - PRIOR ART -
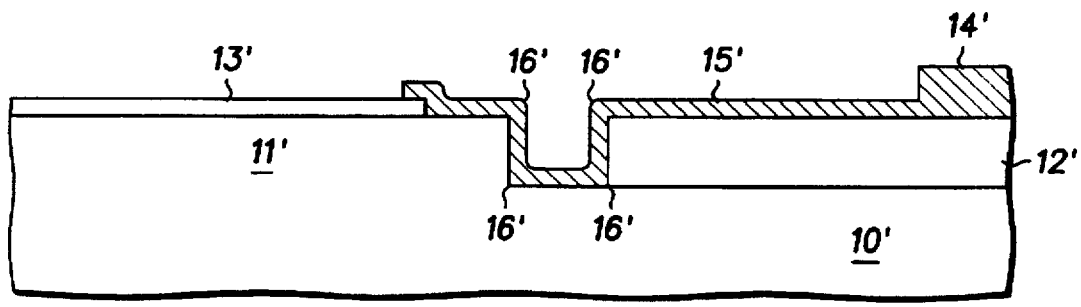
*FIG. 2* - PRIOR ART -
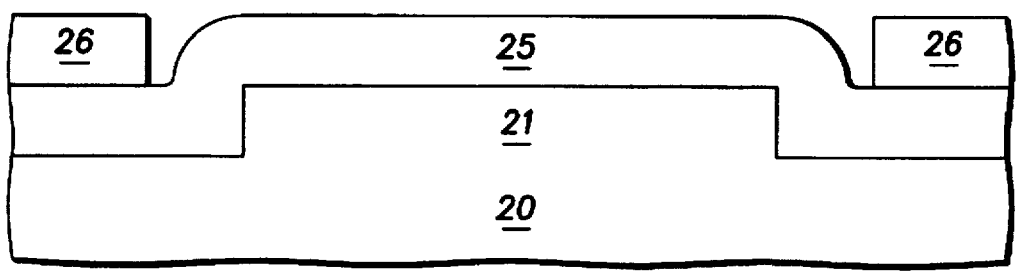
*FIG. 3*
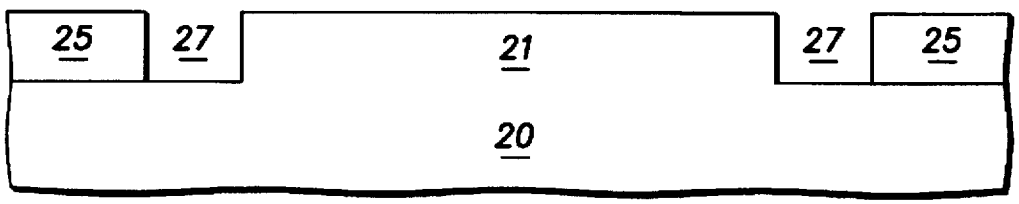
*FIG. 4*

METHOD OF MAKING WIDE BANDGAP SEMICONDUCTOR DEVICES

FIELD OF THE INVENTION

The present invention pertains to wide bandgap semiconductor devices and more specifically to the planarizing of wide bandgap semiconductor devices for further processing.

BACKGROUND OF THE INVENTION

Vertical and lateral silicon carbide MOSFETS and other semiconductor devices are fabricated on conducting substrates. At present wide bandgap semiconductor device wafers are not planar, which complicates device fabrication. Typically, the device region is isolated by etching about 1–2 micrometers into the wafer or substrate, leaving a high mesa on which the device is built. Metal interconnects to other devices on the substrate or to bond pads must be deposited in a way that they provide a continuous connection between the device on top of the mesa and surrounding bond pads or devices which are located on nearby mesas. In order to reduce metal pad capacitance and enhance frequency performance, these pads are fabricated on top of a thick dielectric layer (e.g. silicon dioxide ($SiO_2$)). As a result, the active part of the semiconductor device resides in a tall mesa (1–2 micrometers) with steep sidewalls. The current process leaves a deep trench or moat around the device mesa which causes interconnect metal continuity problems. At present only sputtered metal can bridge this moat. The lack of planarity also presents problems when defining gate electrodes. A nearly perfectly planar structure which includes a thick field oxide and device mesa is required.

Planar electronic device isolation is very difficult to achieve with semiconductor devices made with wide bandgap semiconductor materials, such as silicon carbide (SIC), gallium nitride (GAN), diamond (including diamond-like carbon and other variations), etc. This is a result of the unique physical and chemical properties of these materials. In general, these wide bandgap materials require extremely high temperatures for such processes as oxidation and ion implant activation. For example, to oxidize SiC, a temperature of 1245° C. is required for approximately 30 hours to produce one micrometer of oxide. These high processing temperatures make achieving planar device surfaces very difficult.

Planarizing is performed extensively in silicon wafers, for example planarizing intermetal dielectrics in silicon VLSI multilayer interconnect metal stacks, but this is entirely different than planarizing substrates formed of wide bandgap materials. Another prior art planarizing method is the use of chemical-mechanical polish. For this process expensive and specialized polishing equipment is required and the wafers must be very flat. A third prior art planarizing method is a two layer photo process which requires accurate mask level to level alignment, which requires a great deal of time and expense. An isotropic etch planarization method using image reversal is described in U.S. Pat. No. 5,139,608, entitled "Isotropic Etch Planarization Using Image Reversal", and issued. This process also requires accurate and reproducible mask level to mask level registration and tight photo process control Accordingly, it is highly desirable to provide a process of planarizing wide bandgap semiconductor devices utilizing relatively low processing temperatures.

It is a purpose of the present invention to provide a new and improved method of planarizing wide bandgap semiconductor devices.

It is another purpose of the present invention to provide a new and improved method of planarizing wide bandgap semiconductor devices utilizing relatively low processing temperatures.

It is a further purpose of the present invention to provide a new and improved method of planarizing wide bandgap semiconductor devices which is relatively simple and inexpensive to perform and which is highly repeatable.

It is a still further purpose of the present invention to provide new and improved planarized wide bandgap semiconductor devices.

SUMMARY OF THE INVENTION

The above problems and others are at least partially solved and the above purposes and others are realized in a method of planarizing wide bandgap semiconductor devices including providing a wide bandgap semiconductor substrate with a mesa formed thereon defining an isolated semiconductor device region having a predetermined height. A layer of dielectric material is deposited on the substrate overlying and surrounding the mesa, the layer of dielectric material being deposited to a height approximately equal to the height of the mesa. The layer of dielectric material is then etched from atop the mesa and from a surrounding area. Layers of spin on glass are deposited on the substrate to fill the surrounding area and the layers of spin on glass are etched to achieve a planar surface including the mesa and the layer of dielectric material.

The above problems and others are at least partially solved and the above purposes and others are further realized in a planarized substrate formed in accordance with the above method.

BRIEF DESCRIPTION OF THE DRAWINGS

Referring to the drawings:

FIGS. 1 and 2 are simplified cross-sectional views illustrating the problem of electrically connecting a wide bandgap semiconductor device to a bonding pad;

FIGS. 3 through 6 illustrate various steps in a process of planarizing a semiconductor device in accordance with the present invention.

DESCRIPTION OF THE PREFERRED EMBODIMENTS

Figure 5:
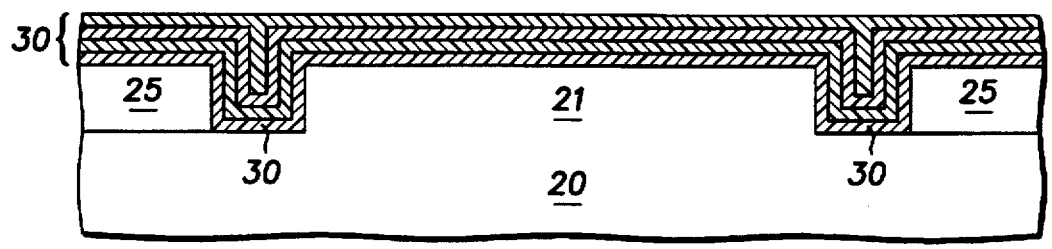

Turning now to FIGS. 1 and 2, wherein simplified cross-sectional views of electrical connections between a wide bandgap semiconductor device and a bonding pad are illustrated to highlight the problem. Referring specifically to FIG. 1, a wide bandgap substrate is illustrated having a 2 micrometer high device mesa 11 formed on the surface thereof. A layer 12 of field oxide is deposited on the surface of substrate 10 surrounding and overlying mesa 11. Layer 12 is formed with a thickness (2 micrometers) equal to the height of mesa 11 and a portion is removed on the surface of mesa 11 to allow the formation of a gate contact 13. A bonding pad 14 is formed on the surface of layer 12, spaced from mesa 11, and an electrical connection 15 from gate 13 to bonding pad 14 is provided. Because layer 12 will be formed conformally, the thickness is 2 micrometers throughout, including on top of mesa 11. Thus electrical connection 15 must traverse a ridge in layer 12, which results in many sharp corners, or edges 16 that create many opportunities for breaks or weaknesses in electrical connection 15.

Referring specifically to FIG. 2, a second wide bandgap substrate 10' is illustrated, with components similar to those in FIG. 1 being designated with similar numbers having a prime added to indicate the different structure. As described above, a 2 micrometer high device mesa 11' is formed on the surface of substrate 10'. A layer 12' of field oxide is deposited on the surface of substrate 10' surrounding and overlying mesa 11'. Layer 12' is formed with a thickness (2 micrometers) equal to the height of mesa 11' and a portion is removed on the surface of mesa 11', to allow the formation of a gate contact 13', and in an area surrounding mesa 11', which results in a trench between mesa 11' and layer 12'. A bonding pad 14' is formed on the surface of layer 12', spaced from mesa 11', and an electrical connection 15' from gate 13' to bonding pad 14' is provided. Thus electrical connection 15' must traverse the trench surrounding mesa 11', which results in many sharp corners, or edges 16' that create many opportunities for breaks or weaknesses in electrical connection 15'. Clearly, planarizing the semiconductor device, or substrate, is essential to good and reliable electrical connections.

Turning now to FIGS. 3 through 6, various steps in a process of planarizing a semiconductor device in accordance with the present invention are illustrated. Referring specifically to FIG. 3, a wide bandgap semiconductor substrate 20 is provided. Generally, substrate 20 will be conducting and is made with wide bandgap semiconductor materials, such as silicon carbide (SIC), gallium nitride (GAN), diamond (including diamond-like carbon and other variations), etc. A device mesa 21 is etched in the upper surface of substrate 20 using any convenient etching procedure, such as reactive ion etch, or the like. Mesa 21 is etched to a final height in the range of approximately 1–2 micrometers. Mesa 21 is provided primarily for the isolation of a semiconductor device (or device region) fabricated thereon, which fabrication will not be detailed herein since it is well known in the art.

A layer 25 of dielectric material is conformally deposited on the surface of substrate 20, surrounding and covering mesa 21. Layer 25 of dielectric material is deposited to a height, or thickness, approximately equal to the height of mesa 21, i.e. in the range of approximately 1–2 micrometers. As described above, the dielectric material of layer 25 is chosen to reduce the capacitance of bonding pads, to be described presently. In a specific example, substrate 20 is formed of SiC and the dielectric material of layer 25 is $SiO_2$. In some applications it may be desirable, to improve adhesion of layer 25, to grow a thin layer of $SiO_2$ on substrate 20 prior to the deposition of layer 25. Generally such a thin grown layer of $SiO_2$ will not exceed 1000 angstroms and is, preferably about 700 angstroms. Layer 25 is deposited by a technique, such as plasma enhanced chemical vapor deposition or the like, and is generally densified by annealing layer 25 at about 650° C.

A photo etch mask 26, or similar etch mask, is applied to the surface of layer 25 and used to remove portions of layer 25 from atop device mesa 21 and in a surrounding region 27 immediately adjacent device mesa 21. This leaves layer 25 and device mesa 21 at the same height, with a trench (surrounding region 27) having a width in the range of 1–2 micrometers and a width in the range of 2–10 micrometers, surrounding device mesa 21, as illustrated in FIG. 4.

Figure 6:
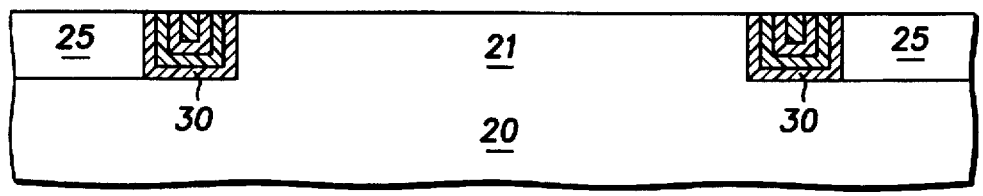

Layers 30 of spin on glass are then deposited on the structure to fill surrounding area 27, as illustrated in FIG. 5. To apply a first layer of layers 30, the surface of substrate 20 (generally the entire structure but including at least surrounding region 27) is precleaned. In a specific example, the structure is precleaned with a dilute buffered HF oxide etch, rinsed in deionized water, blown dried, and dehydrated on a hot plate at 240° C. A substantially uniform coat of spin on glass is applied and cured on a hot plate at 240° C. and in a rapid thermal anneal at 650° C. The above procedure is repeated, beginning with the precleaning step, for each additional layer of layers 30 which is applied. Generally, the number of layers in layers 30 depends on the depth of surrounding region 27, but typically is about 3 to 5 layers. Finally, spin on glass layers 30 are etched back to achieve a planar surface including the upper surface of mesa 21 and the upper surface of layer 25 of dielectric material, as illustrated in FIG. 6.

Figure 7:
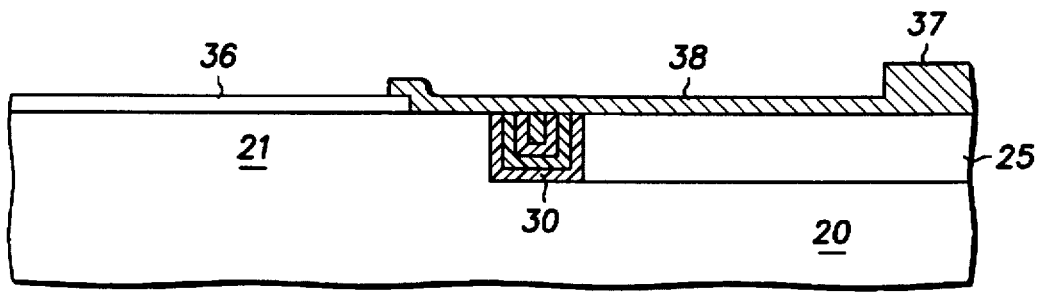
FIG. 7 is a simplified cross-sectional view of a semiconductor device fabricated in accordance with the present invention.

Referring to FIG. 7, a completed semiconductor device 35 fabricated in accordance with the present invention is illustrated. Once spin on glass layers 30 are etched back to achieve a planar surface, additional device processing steps continue in the normal and well known manner. Contact, or contacts 36, are formed on device mesa 21. A bonding pad, or bonding pads 37 are formed on layer 25 in spaced relationship to mesa 21 and electrical connections 38 are formed between contacts 36 and bonding pads 37.

Because the upper surface of device 35 is planarized, there are no breaks or sharp edges in electrical connections 38, thus providing very reliable and consistent connections. Also, a process of planarizing wide bandgap semiconductor devices utilizing relatively low processing temperatures is provided, since no very high heating steps, such as are required for oxidizing or annealing wide bandgap material, are utilized (except for the thin oxide layer grown to improve adhesion in the embodiment described above). Thus, a new and improved method of planarizing wide bandgap semiconductor devices is disclosed which is relatively simple and inexpensive to perform and which is highly repeatable. Also, new and improved planarized wide bandgap semiconductor devices are provided which are more consistent and reliable.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of planarizing wide bandgap semiconductor devices comprising the steps of:

providing a wide bandgap semiconductor substrate with a mesa formed thereon defining an isolated semiconductor device region having a height, the device region including a semiconductor device on a surface of the mesa;

depositing a layer of dielectric material on the substrate overlying and surrounding the mesa, the layer of dielectric material being deposited to a height approximately equal to the height of the mesa;

etching the layer of dielectric material from atop the mesa and from a surrounding area to define a portion of dielectric material spaced from the mesa by an isolating trench, the portion of dielectric material having a surface at the height approximately equal to the height of the mesa;

depositing layers of spin on glass to fill the isolating trench;

etching the layers of spin on glass to achieve a planar surface including the surface of the mesa, a surface of the spin on glass in the isolating trench, and the surface of the portion of dielectric material; and forming an electrical contact on the surface of the mesa in communication with the semiconductor device and forming an electrical connection on the planar surface from the electrical contact on the surface of the mesa to a connection across the surface of the spin on glass.

2. A method of planarizing wide bandgap semiconductor devices comprising the steps of:

providing a wide bandgap semiconductor substrate;

etching the substrate to form a mesa defining an isolated semiconductor device region having a height, the device region including a semiconductor device on a surface of the mesa;

depositing a layer of dielectric material on the substrate overlying and surrounding the mesa, the layer of dielectric material being deposited to a height approximately equal to the height of the mesa;

etching the layer of dielectric material from atop the mesa and from a surrounding area to define a portion of dielectric material spaced from the mesa by an isolating trench, the portion of dielectric material having a surface at the height approximately equal to the height of the mesa;

depositing layers of spin on glass to fill the isolating trench;

etching the layers of spin on glass to achieve a planar surface including the surface of the mesa, a surface of the spin on glass in the isolating trench, and the surface of the portion of dielectric material; and forming an electrical contact on the surface of the mesa in communication with the semiconductor device, forming a bonding pad on the surface of the portion of dielectric material and forming an electrical connection on the planar surface from the contact on the surface of the mesa to the bonding pad on the surface of the portion of dielectric material.

3. A method of planarizing wide bandgap semiconductor devices as claimed in claim 2 wherein the step of providing the wide bandgap semiconductor substrate includes providing a substrate selected from a group including SiC, GaN and diamond.

4. A method of planarizing wide bandgap semiconductor devices as claimed in claim 2 wherein the step of etching the substrate to form the mesa includes etching the substrate to a depth in the range of approximately 1 to 2 micrometers to provide a mesa in the range of approximately 1 to 2 micrometers.

5. A method of planarizing wide bandgap semiconductor devices as claimed in claim 4 wherein the step of etching the substrate to the depth in the range of approximately 1 to 2 micrometers includes etching the substrate using reactive ion etch technology.

6. A method of planarizing wide bandgap semiconductor devices as claimed in claim 2 wherein the step of etching the layer of dielectric material to define the portion of dielectric material spaced from the mesa by the isolating trench includes etching the trench to a depth in the range of approximately 1 to 2 micrometers and to a width in the range of 2 to 10 micrometers.

7. A method of planarizing wide bandgap semiconductor devices as claimed in claim 2 wherein the step of depositing the layer of dielectric material on the substrate includes depositing a layer of $SiO_2$.

8. A method of planarizing wide bandgap semiconductor devices as claimed in claim 7 wherein the step of providing the wide bandgap semiconductor substrate includes providing a substrate of SiC and the step of depositing the layer of $SiO_2$ includes a preceding step of growing $SiO_2$ on the SiC substrate to a depth less than approximately 1000 angstroms.

9. A method of planarizing wide bandgap semiconductor devices as claimed in claim 2 wherein the step of depositing the layer of dielectric material on the substrate includes depositing the layer of dielectric material using plasma enhanced chemical vapor deposition.

10. A method of planarizing wide bandgap semiconductor devices as claimed in claim 9 including in addition a step of annealing the layer of dielectric material subsequent to the step of depositing the layer of dielectric material using plasma enhanced chemical vapor deposition.

11. A method of planarizing wide bandgap semiconductor devices as claimed in claim 10 wherein the step of annealing the layer of dielectric material includes annealing the layer of dielectric material at a temperature of approximately 650° C.

12. A method of planarizing wide bandgap semiconductor devices as claimed in claim 2 wherein the step of etching the layer of dielectric material includes utilizing an etch mask to define the surrounding area.

13. A method of planarizing wide bandgap semiconductor devices as claimed in claim 2 wherein the step of depositing layers of spin on glass includes a step of precleaning the surrounding area prior to depositing layers of spin on glass.

14. A method of planarizing wide bandgap semiconductor devices as claimed in claim 13 wherein the step of precleaning the surrounding area includes precleaning with a dilute buffered HF oxide etch, rinsing in deionized water, blowing dry and dehydrating.

15. A method of planarizing wide bandgap semiconductor devices as claimed in claim 13 wherein the step of depositing layers of spin on glass includes, subsequent to the step of precleaning the surrounding area, a step of applying a coat of spin on glass and curing the coat of spin on glass at a temperature of approximately 240° C. and in a rapid thermal anneal at a temperature of approximately 650° C.

16. A method of planarizing wide bandgap semiconductor devices as claimed in claim 15 wherein the step of depositing layers of spin on glass includes depositing 3 to 5 layers and the steps of precleaning and curing are performed for each layer.

17. A method of planarizing wide bandgap semiconductor devices comprising the steps of:

providing a wide bandgap semiconductor substrate selected from a group including SiC, GaN and diamond;

etching the substrate to form a mesa defining an isolated semiconductor device region including a semiconductor device on a surface of the mesa;

depositing a layer of dielectric material on the substrate overlying and surrounding the mesa, the layer of dielectric material being deposited to a height approximately equal to the height of the mesa;

etching the layer of dielectric material from atop the mesa and from a surrounding area to define a portion of dielectric material spaced from the mesa by an isolating trench, the portion of dielectric material having a surface at the height approximately equal to the height of the mesa, the isolating trench being etched to a depth in the range of approximately 1 to 2 micrometers and to a width in the range of 2 to 10 micrometers;

depositing layers of spin on glass to fill the isolating trench;

etching the layers of spin on glass to achieve a planar surface including the surface of the mesa, a surface of the spin on glass in the isolating trench, and the surface of the portion of dielectric material; and forming an electrical contact on the surface of the mesa in communication with the semiconductor device and forming an electrical connection on the planar surface from the electrical contact on the surface of the mesa to a connection across the surface of the spin on glass.

18. A method of planarizing wide bandgap semiconductor devices as claimed in claim 17 wherein the step of depositing the layers of spin on glass includes a step of precleaning the surrounding area prior to depositing the layers of spin on glass.

19. A method of planarizing wide bandgap semiconductor devices as claimed in claim 18 wherein the step of precleaning the surrounding area includes precleaning with a dilute buffered HF oxide etch, rinsing in deionized water, blowing dry and dehydrating.

20. A method of planarizing wide bandgap semiconductor devices as claimed in claim 18 wherein the step of depositing layers of spin on glass includes, subsequent to the step of precleaning the surrounding area, a step of applying a coat of spin on glass and curing the coat of spin on glass at a temperature of approximately 240° C. and in a rapid thermal anneal at a temperature of approximately 650° C.

21. A method of planarizing wide bandgap semiconductor devices as claimed in claim 20 wherein the step of depositing layers of spin on glass includes depositing 3 to 5 layers and the steps of precleaning and curing are performed for each layer.

* * * * *